United States Patent
Panda et al.

(10) Patent No.: US 12,265,731 B2
(45) Date of Patent: Apr. 1, 2025

(54) PARTIAL ROW REFRESH IN A MEMORY DEVICE

(71) Applicant: QUALCOMM Incorporated, San Diego, CA (US)

(72) Inventors: Subham Panda, Balasore (IN); Muzaffaruddin Mohammed, Hyderabad (IN); Venkatesh Petnikota, Kurnool (IN); Sri Ananda Sai Jannabhatla, Hyderabad (IN); Jyothi Ramidi, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/351,909

(22) Filed: Jul. 13, 2023

(65) Prior Publication Data

US 2025/0021263 A1 Jan. 16, 2025

(51) Int. Cl.
*G06F 3/06* (2006.01)

(52) U.S. Cl.
CPC .......... *G06F 3/0658* (2013.01); *G06F 3/0619* (2013.01); *G06F 3/0673* (2013.01)

(58) Field of Classification Search
CPC ...... G06F 3/064; G06F 3/0619; G06F 3/0673; G06F 3/0625; G06F 658/59; G06F 3/0658; G11C 11/401–403; G11C 11/40607; G11C 11/40611; G11C 11/40615; G11C 13/0033; G11C 29/08; G11C 2211/406; G05B 2219/34193; G09G 3/3618
See application file for complete search history.

(56) References Cited

U.S. PATENT DOCUMENTS

| | | | |
|---|---|---|---|
| 2006/0010264 A1* | 1/2006 | Rader | G06F 13/385 710/308 |
| 2019/0189194 A1* | 6/2019 | Kim | G11C 5/148 |
| 2022/0293169 A1* | 9/2022 | Meier | G11C 11/4087 |
| 2023/0420026 A1* | 12/2023 | Chen | G11C 11/40611 |
| 2024/0144988 A1* | 5/2024 | Seo | G11C 11/406 |

OTHER PUBLICATIONS

Ha H., et al., "Improving Energy Efficiency of DRAM by Exploiting Half Page Row Access", 2016 49th Annual IEEE/ACM International Symposium on Microarchitecture (MICRO), IEEE, Oct. 15, 2016, 12 Pages, XP033022434, Sections II.C-D & III, Figures 4, 5.

(Continued)

*Primary Examiner* — Rocio Del Mar Perez-Velez
*Assistant Examiner* — Julian S Mendel
(74) *Attorney, Agent, or Firm* — NORTON ROSE FULBRIGHT US LLP/Qualcomm

(57) ABSTRACT

This disclosure provides systems, methods, and devices for memory systems that support partial row refresh operation of a memory system. In a first aspect, a method of refreshing a memory array includes obtaining, by a memory controller from a host device through a channel, partial row refresh information associated with a first row in a memory array and refreshing, by the memory controller, a portion of the first row in the memory array based on the partial row refresh information. Other aspects and features are also claimed and described.

18 Claims, 14 Drawing Sheets

(56) References Cited

OTHER PUBLICATIONS

International Search Report and Written Opinion—PCT/US2024/031724—ISA/EPO—Oct. 7, 2024.
R Arjun., et al., "Design of Low-Power DDR Controller and DRAM for Deep Learning and Server Applications", 2021 IEEE 4th International Conference on Computing, Power and Communication Technologies (GUCON), IEEE, Sep. 24, 2021, pp. 1-6, XP034006218, Sections III.A-C, Figures 1-3.

* cited by examiner

PARTIAL ROW REFRESH IN A MEMORY DEVICE

TECHNICAL FIELD

Aspects of the present disclosure relate generally to computer information systems, and more particularly, to memory systems for storing data. Some features may enable and provide improved memory capabilities for lower power operation through use of partial row refresh of memory cells in the memory system.

INTRODUCTION

A computing device (e.g., a laptop, a mobile phone, etc.) may include one or several processors to perform various computing functions, such as telephony, wireless data access, and camera/video function, etc. A memory system is an important component of the computing device. The processors may be coupled to the memory system to perform the aforementioned computing functions. For example, the processors may fetch instructions from the memory system to perform the computing functions and/or to store within the memory system temporary data involved in performing these computing functions.

Memory systems may make use of memory cells that are volatile in nature. Volatile memory cells retain information for short periods of time, such as fractions of a second. A refresh operation may be performed with volatile memory cells to maintain the information for longer periods of time. In an example volatile memory cell storing information as an electrical charge, the electrical charge decays over a fraction of a second. Before the charge decays beyond the point of lost information, the memory cell may be refreshed to extend the period of time that the memory cell retains the information. In some cases the refresh may be repeatedly performed to extend the period of storage of the information indefinitely, or as long as electricity is supplied to the circuit. This refresh operation consumes power, which impacts the operation of devices operating from limited power sources, such as with mobile devices operating from battery power.

One conventional technique for reducing power consumption is Partial-Array Self-Refresh (PASR), which is a lower-power refresh mode in which some banks in the memory system are refreshed while other banks are turned off to save power. The non-refreshed banks will lose information stored therein.

BRIEF SUMMARY OF SOME EXAMPLES

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In some aspects, a partial row refresh technique is described for memory systems to allow a refresh operation to maintain information stored in specific portions of rows of memory cells of the memory system. The partial row refresh technique may be performed by refreshing a portion of a row based on partial row refresh information. As one example, partial row refresh information for a row may indicate that a certain portion of the row should be refreshed, such as twenty-five percent of the row, fifty percent of the row, seventy-five percent of the row, or one-hundred percent of the row. Partial row refresh information may be determined based on an amount of data stored in the row and may be included in address information for the row. Thus, a portion of a memory row may be refreshed based on an amount of data stored in the memory row.

In some embodiments, the partial row refresh operation based on the partial row refresh information may be performed during a sleep mode of a processor of a host device, or other logic device. The processor may enter a sleep mode when the user presses a power button or when the user does not interact with the device for a predefined period of time. Before entering the sleep mode, the processor may save data, such as context data, to one or more rows of the memory and may generate partial row refresh information based on storage of the data to one or more rows of the memory. Such generation may include generating address information for the respective rows including respective partial row refresh information indicating an amount of data stored in each row. The processor may output the partial row refresh information, such as the address information including the partial row refresh information, to the memory system, which may store the partial row refresh information in a register and/or memory cells of the memory array. The processor may then instruct the system to the memory system to enter a self-refresh mode, such as a PASR mode, during which the memory system performs refresh operations without input from the processor. The processor may then enter a sleep state or mode during which power consumption by the processor is reduced. Example sleep states or modes may include C0 (Active), C1 (Auto Halt), C2 (Stop Clock), C3 (Deep Sleep), and C4 (Deeper Sleep). Different sleep states or modes may correspond to states or modes in which different parts or combinations of parts of the processor are turned off or reduced in power.

Partial refresh of rows of a memory while in the self-refresh mode may reduce a power consumption of the memory system, such as by up to seventy-five percent, while in the self-refresh mode. In automotive applications, for example, where memory systems may encounter extreme temperatures, up to and exceeding 2 mAh of battery power may be saved during a fifteen minute period while the memory is in the self-refresh mode compared to per-bank memory refreshing. In applications where a system including a host device and a memory device enters a sleep state or low power mode frequently, up to and exceeding 1 mAh may be saved during a fifteen minute period while the memory is in the self-refresh mode compared to per-bank memory refreshing. A life span of the memory system, such as a life span of double data rate (DDR) memory system may be extended through use of partial row refreshing, as sense amplifiers for performing the refreshing may be activated less frequently. Furthermore, application of partial row refresh techniques may be compatible with existing DDR dynamic random access memory (DRAM) chips.

These aspects may be embodied as a sequence of commands transmitted from a host to a memory system. The commands transmitted by the host may include commands to read capabilities from the memory system, set configurations in the memory system, read data at one or more specified addresses from the memory system, and/or write data at one or more specified addresses to the memory system. For example, a host device may comprise a processor and may be coupled to a memory system. The host device, based on instructions from the processor, may issue command(s) to set the partial row refresh information in the memory system and may subsequently issue command(s) to initiate a self-refresh operating mode for the memory system, during which the memory system refreshes portions of rows based on the partial row refresh information without further instruction from the processor. The processor may wake up out of a sleep state at a later time and issues command(s) to exit the self-refresh operating mode.

An apparatus in accordance with at least one embodiment includes a memory system configured to communicate with a host. The memory system includes a memory array configured to store data. The memory system may include a memory controller configured to provide the data stored in the memory array to the host for further processing by the processor or other components of the host. The memory controller may also be configured to receive data from the host for storage in the memory array. In some embodiments, the memory array may be a plurality of volatile memory cells organized in rows and columns, such as in a DRAM or static random access memory (SRAM). In other embodiments, the memory array may be a plurality of non-volatile memory cells or a mixture of volatile and non-volatile memory cells.

An apparatus in accordance with at least one other embodiment includes a host device with a memory controller configured to communicate with a memory system to receive data stored in the memory array and/or to store data in the memory array. The host device may be, for example, a user equipment (UE) device such as a cellular phone, a tablet computing device, a personal computer, a server, a smart watch, or an internet of things (IoT) device.

In one aspect of the disclosure, a method for partial row refresh in a memory device includes obtaining, by a memory controller from a host device through a channel, partial row refresh information associated with a first row in a memory array and refreshing, by the memory controller, a portion of the first row in the memory array based on the partial row refresh information.

In an additional aspect of the disclosure, an apparatus includes a memory controller coupled to a memory array through a data bus and configured to access data stored in the memory array through the data bus, the memory controller configured to couple to a host device through a channel. The memory controller is configured to perform operations comprising obtaining, from the host device through the data channel, partial row refresh information associated with a first row in the memory array and refreshing a portion of the first row in the memory array based on the partial row refresh information. The memory controller may, for example, be a processor, controller, or other logic circuitry in a host. The processor may alternatively be a controller embedded in a memory device.

In an additional aspect of the disclosure, an apparatus includes means for obtaining, by a memory controller from a host device through a channel, partial row refresh information associated with a first row in a memory array and means for refreshing, by the memory controller, a portion of the first row in the memory array based on the partial row refresh information.

In one aspect of the disclosure, a method for partial row refresh in a memory device includes saving, by at least one processor of a host device coupled to a memory controller of a memory system through a channel, data to a first portion of a first row in a memory array of the memory system through the memory controller, determining, by the at least one processor, partial row refresh information for the first row based on the saving of data to the first portion of the first row, and copying, by the at least one processor through the memory controller, the partial row refresh information to the memory system.

In an additional aspect of the disclosure, an apparatus includes at least one processor and a memory controller coupled to the at least one processor and to a memory system through a channel and configured to communicate with the memory system through the channel. The at least one processor is configured to perform operations comprising saving data to a first portion of a first row in a memory array of the memory system through the memory controller, determining partial row refresh information for the first row based on the saving of data to the first portion of the first row, and copying, through the memory controller, the partial row refresh information to the memory system. The memory controller may, for example, be a processor, controller, or other logic circuitry in a host. The processor may alternatively be a controller embedded in a memory device.

In an additional aspect of the disclosure, an apparatus includes means for saving, by at least one processor of a host device coupled to a memory controller of a memory system through a channel, data to a first portion of a first row in a memory array of the memory system through the memory controller, means for determining, by the at least one processor, partial row refresh information for the first row based on the saving of data to the first portion of the first row, and means for copying, by the at least one processor through the memory controller, the partial row refresh information to the memory system.

In an additional aspect of the disclosure, an apparatus, such as a wireless device, includes at least one processor and a memory coupled to the at least one processor. The at least one processor is configured to communicate with the memory system through a memory controller coupled to a channel that couples the processor to the memory system. The processor may be a processor, controller, or other logic circuitry in a host.

In an additional aspect of the disclosure, a non-transitory computer-readable medium stores instructions that, when executed by a processor, cause the processor to perform operations described herein regarding aspects of the disclosure.

Memory systems in the present disclosure may be embedded within a processor on a semiconductor die or be part of a different semiconductor die. The memory systems may be of various kinds. For example, the memory may be static random access memory (SRAM), dynamic random access memory (DRAM), magnetic random access memory (MRAM), NAND flash, or NOR flash, etc.

Methods and apparatuses are presented in the present disclosure by way of non-limiting examples of Low-Power Double Data Rate (LPDDR) Synchronous Dynamic Random Access Memory (SDRAM). For example, the LPDDR memory operating in accordance with LPDDR specification promulgated by Joint Electronic Device Engineering Council (JEDEC). One such LPDDR specification may be LPDDR5. Another such LPDDR specification may be LPDDR6.

Other aspects, features, and implementations will become apparent to those of ordinary skill in the art, upon reviewing the following description of specific, exemplary aspects in conjunction with the accompanying figures. While features may be discussed relative to certain aspects and figures below, various aspects may include one or more of the advantageous features discussed herein. In other words, while one or more aspects may be discussed as having certain advantageous features, one or more of such features may also be used in accordance with the various aspects. In similar fashion, while exemplary aspects may be discussed below as device, system, or method aspects, the exemplary aspects may be implemented in various devices, systems, and methods.

The method may be embedded in a computer-readable medium as computer program code comprising instructions that cause a processor to perform the steps of the method. In some embodiments, the processor may be part of a mobile device including a first network adaptor configured to transmit data, such as images or videos in a recording or as streaming data, over a first network connection of a plurality of network connections. The processor may be coupled to the first network adaptor and a memory for storing data to support the processing and communications operations performed by the processor. The network adaptor may support communication over a wireless communications network such as a 5G NR communication network. The processor may cause the transmission of data stored in memory over the wireless communication network.

The foregoing has outlined, rather broadly, the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, aspects and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for implementation and practice of claimed and described aspects. For example, transmission and reception of wireless signals necessarily includes a number of components for analog and digital purposes (e.g., hardware components including antenna, radio frequency (RF)-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Like reference numbers and designations in the various drawings indicate like elements.

DETAILED DESCRIPTION

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

The present disclosure provides systems, apparatus, methods, and computer-readable media that support data processing, including techniques for a partial row refresh technique that allows a refresh operation to maintain the information stored in parts of rows of memory cells of a memory system. The partial row refresh technique may be performed by activating only portions of rows including stored data to reduce power consumption by the refresh operation and enhance longevity of the memory system. In different embodiments, the parts of rows to be refreshed may be determined based on partial row refresh information. Such information may, for example, be determined based on an amount of data stored in each respective row.

Particular implementations of the subject matter described in this disclosure may be implemented to realize one or more of the following potential advantages or benefits. In some aspects, the present disclosure provides for reduced power consumption by refreshing portions of rows based on an amount of data stored in the rows. As less than an entire row may be refreshed when an entire row is not used for storage of information, power consumption may be reduced by up to and exceeding 2 mAh per 15 minute sleep period, depending on environmental factors such as temperature. Furthermore, less frequent activation of sense amplifiers to refresh blocks of a row of a memory array may enhance longevity of the memory array.

Figure 1:
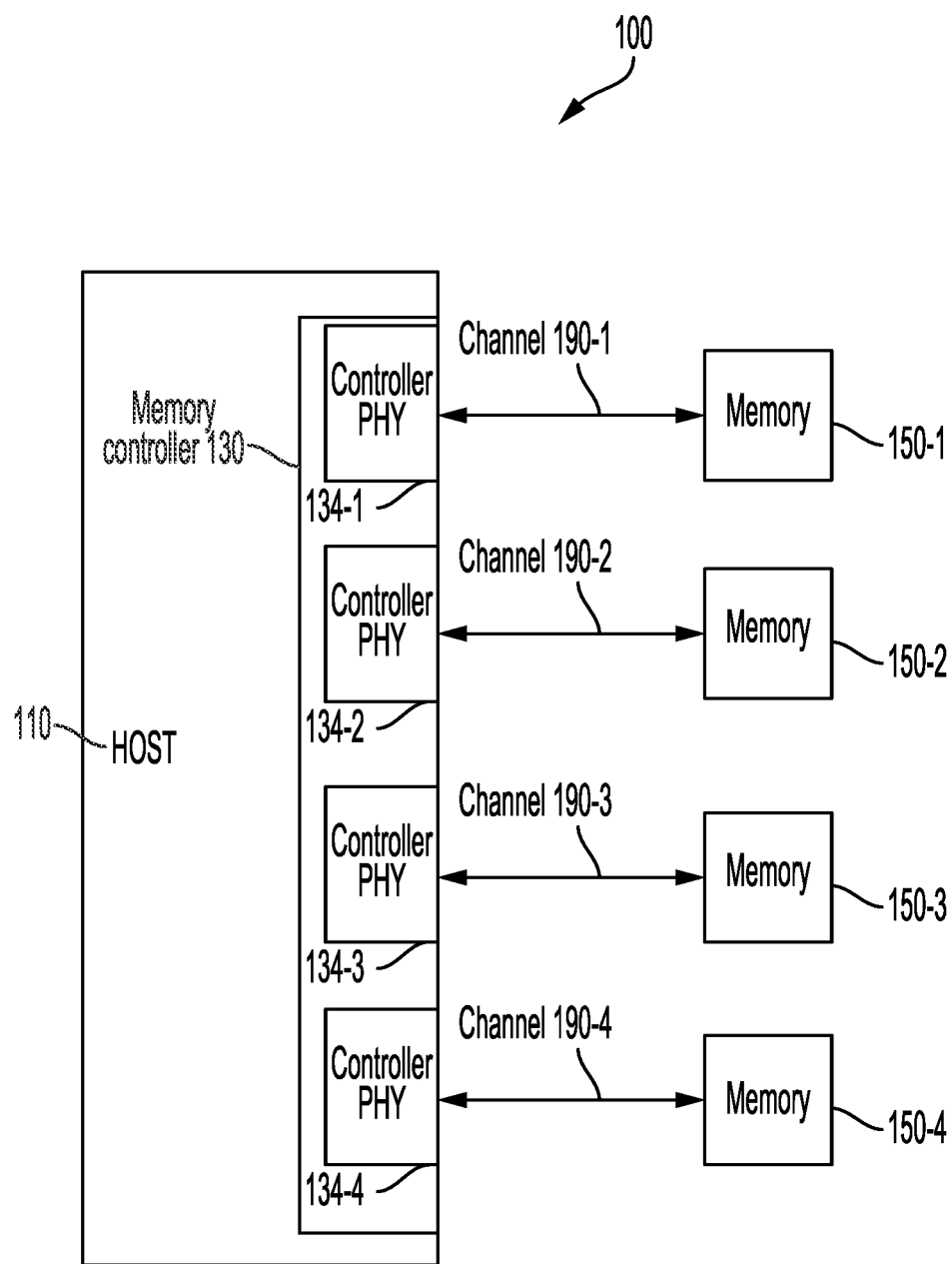
FIG. 1 shows a block diagram of an example computing system incorporating a host, memory system, and channels coupling the host and the memory system according to one or more aspects of the disclosure.

An example memory device that may incorporate aspects of this disclosure, including partial row refresh based on partial row refresh information, is shown in FIG. 1. FIG. 1 illustrates an apparatus 100 incorporating a host 110, memories 150, and channels 190 coupling the host 110 and the memories 150. The apparatus 100 may be, for example, a device among computing systems (e.g., servers, datacenters, desktop computers), mobile computing device (e.g., laptops, cell phones, vehicles, etc.), Internet of Things devices, virtual reality (VR) systems, augmented reality (AR) systems, automobile systems (e.g., driver assistance systems, autonomous driving systems), image capture devices (e.g., stand-alone digital cameras or digital video camcorders, camera-equipped wireless communication device handsets, such as mobile telephones, cellular or satellite radio telephones, personal digital assistants (PDAs), panels or tablets, gaming devices, computing devices such as webcams, video surveillance cameras, or other devices with digital imaging or video capabilities), and/or multimedia systems (e.g., televisions, disc players, streaming devices).

The host 110 may include at least one processor, such as central processing unit (CPU), graphic processing unit (GPU), digital signal processor (DSP), multimedia engine, and/or neural processing unit (NPU). The host 110 may be configured to couple and to communicate to the memories 150 (e.g., memories 150-1 to 150-4), via channels 190 (e.g., channels 190-1 to 190-4), in performing the computing functions, such as one of data processing, data communication, graphic display, camera, AR or VR rendering, image processing, neural processing, etc. For example, the memories 150-1 to 150-4 may store instructions or data for the host to perform the computing functions.

The host 110 may include a memory controller 130, which may include controller PHY modules 134-1 to 134-4. Each of the controller PHY modules 134-1 to 134-4 may be coupled to a respective one of the memories 150-1 to 150-4 via respective channels 190-1 to 190-4. For ease of reference, read and write are referenced from a perspective of the host 110. For example, in a read operation, the host 110 may receive via one or more of the channels 190-1-190-4 data stored from one or more of the memories 150-1 to 150-4. In a write operation, the host 110 may provide via one or more of the channels 190-1-190-4 data to be written into one or more of the memories 150-1-150-4 for storage. The memory controller 130 may be configured to control various aspects, such as logic layers, of communications to and from the memories 150-1-150-4. The controller PHY modules 134-1-134-4 may be configured to control electrical characteristics (e.g., voltage levels, phase, delays, frequencies, etc.) of signals provided or received on the channels 190-1-190-4, respectively.

In some examples, the memories 150-1-150-4 may be LPDDR DRAM (e.g., LPDDR5, LPDDR6). In some examples, the memories 150-1-150-4 may be different kinds of memory, such as one LPDDR5, one LPDDR6, one Flash memory, and one SRAM, respectively. The host 110, the memories 150-1-150-4, and/or the channels 190-1-190-4 may operate according to an LPDDR (e.g., LPDDR5, LPDDR6) specification. In some examples, each of the channels 190-1-190-4 may include 16 bits of data (e.g., 16 DQs). In some examples, each of the channels 190-1-190-4 may operate on 32 bits of data (e.g., 32 DQs). In FIG. 1, four channels are shown, however the apparatus 100 may include more or less channels, such as 8 or 16 channels.

Figure 2:
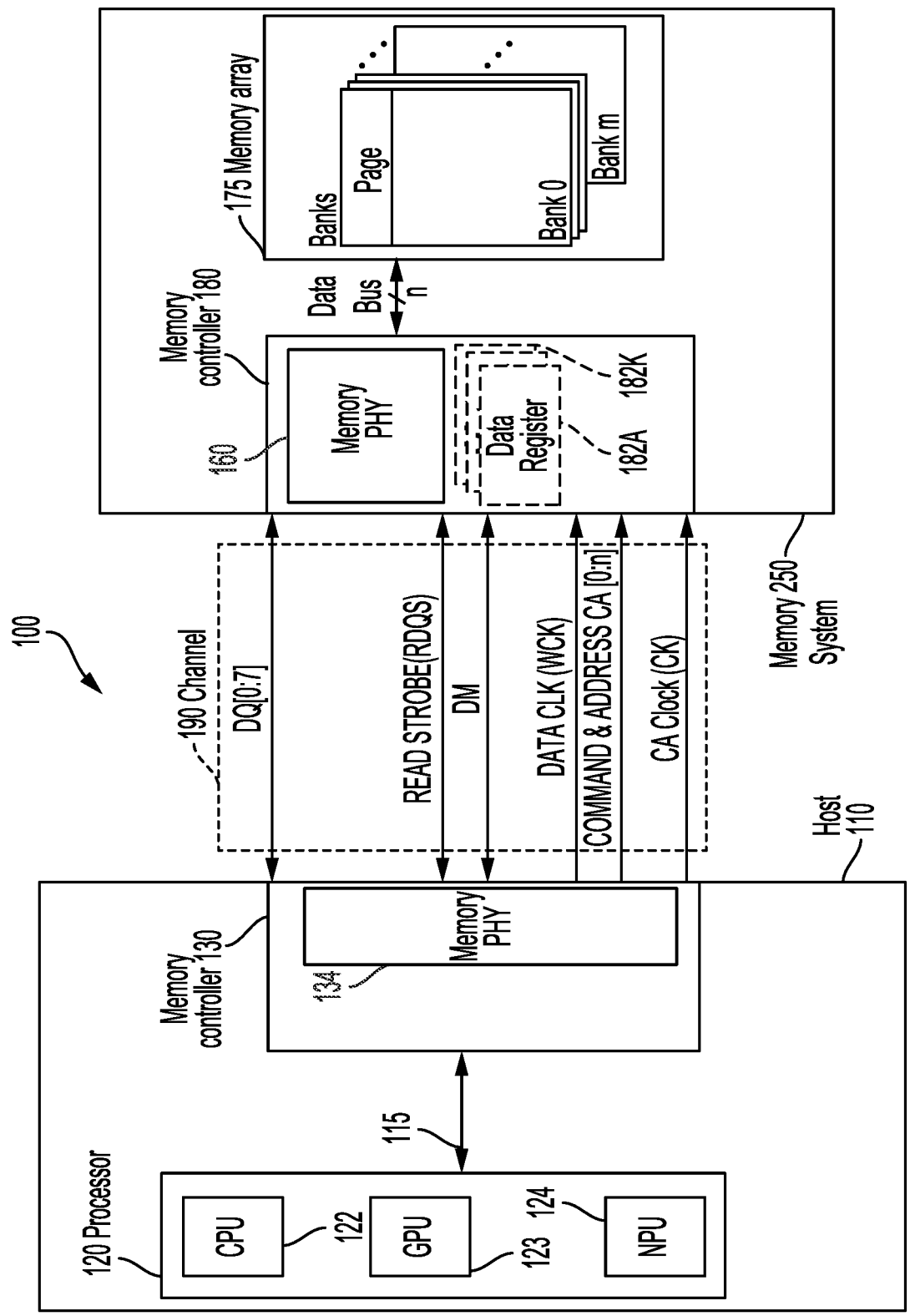
FIG. 2 shows a block diagram of an example computing system incorporating a host, memory system, and channels coupling the host and the memory system with another implementation of the channels according to one or more aspects of the disclosure.

Additional details of an aspect of the embodiment of the apparatus 100 for providing access to a memory system (such as one of memories 150-1-150-4 including logic and control circuit) are shown in FIG. 2. FIG. 2 illustrates a configuration of the host 110, a memory system 250, and the channel 190 according to some aspects of the disclosure. The channel 190 between host 110 and the memory system 250 may include a plurality of connections, some of which carry data (e.g., user data or application data) and some of which carry non-data (e.g., addresses and other signaling information). For example, non-data connections in channel 190 may include a data clock (e.g., WCK) used in providing data to the respective memory system 250 and a read data strobe (e.g., RDQS) used in receiving data from the respective memory system 250, on a per byte basis. The channel 190 may further include a data mask (e.g., DM, sometimes referred to as data mask inversion DMI to indicate multiple functions performed by the signal connection) signaling used to mask certain part of data in a write operation. The channel 190 may further include command and address (e.g., CA[0:n]) and associated CA clock to provide commands (e.g., read or write commands) to the memory system 250.

The host 110 may include at least one processor 120, which may include a CPU 122, a GPU 123, and/or an NPU 124. The host 110 may further include a memory controller 130 having a controller PHY module 134. The memory controller 130 may couple to the at least one processor 120 via a bus system 115 in performing the various computing functions. The term "bus system" may provide that elements coupled to the "bus system" may exchange information therebetween, directly or indirectly. In different embodiments, the "bus system" may encompass multiple physical connections as well as intervening stages such as buffers, latches, registers, etc. A module may be implemented in hardware, software, or a combination of hardware and software.

The memory controller 130 may send and/or receive blocks of data to other modules, such as the at least one processor 120 and/or the memory system 250. The memory system 250 may include a memory controller 180 with a memory I/O module 160 (e.g., a PHY layer) configured to control electrical characteristics (e.g., voltage levels, phase, delays, frequencies, etc.) to provide or to receive signals on connections of the channel 190. For example, memory I/O module 160 may be configured to capture (e.g., to sample) data, commands, and addresses from the host 110 via the channel 190 and to output data to the host 110 via the channel 190. Example techniques for communicating on the channel 190 between the memory I/O module 160 and the memory controller 130 are shown in the examples of FIG. 3A, FIG. 3B, FIG. 4A, and FIG. 4B. The memory controller 180 may also include data registers 182A-K configured to store data in transit between the host 110 and the memory array 175 and/or to store configuration settings or other data.

The memory system 250 may further include a memory array 175, which may include multiple memory cells (e.g., DRAM memory cells, MRAM memory cells, SRAM memory cells, Flash memory cells) that store values. The host 110 may read data stored in the memory array 175 and write data into the memory array 175, via the channel 190 and the memory I/O module 160. The memory array 175 may be divided into a plurality of banks with each bank organized as a plurality of pages.

Application or user data may be processed by the processor 120 and the memory controller 130 instructed to store and/or retrieve such data from the memory system 250. For example, data may be generated during the execution of an application, such as a spreadsheet program that computes values based on other data. As another example, data may be generated during the execution of an application by receiving user input to, for example, a spreadsheet program. As a further example, data may be generated during the execution of a gaming application, which generates information regarding a representation of a scene rendered by a three-dimensional (3-D) application.

The host 110 is coupled to the memory system 250 via the channel 190, which is illustrated for a byte of data, DQ[0:7]. The channel 190 and signaling between the host 110 and the memory system 250 may be implemented in accordance with the JEDEC DRAM specification (e.g., LPDDR5, LPDDR6). As illustrated, the channel 190 includes signal connections of the DQs, a read data strobe (RDQS), a data mask (DM), a data clock (WCK), command and address (CA[0:n]), and command and address clock (CK). The host 110 may use the read data strobe RDQS to strobe (e.g., to clock) data in a read operation to receive the data on the DQs. The memory system 250 may use the data mask DM to mask certain parts of the data from being written in a write operation. The memory system 250 may use the data clock WCK to sample data on the DQs for a write operation. The memory system 250 may use the command and address clock CK to clock (e.g., to receive) the CAs. A signal connection for each of the signaling may include a pin at the host 110, a pin at the memory system 250, and a conductive trace or traces electrically connecting the pins. The conductive trace or traces may be part of a single integrated circuit (IC) on a silicon chip containing the processor 120 and the memory system 250, may be part of a package on package (POP) containing the processor 120 and the memory system 250, or may be part of a printed circuit board (PCB) coupled to both the processor 120 and the memory system 250.

The memory system 250 may include a memory I/O module 160 (e.g., a PHY layer) configured to control electrical characteristics (e.g., voltage levels, phase, delays, frequencies, etc.) to provide or to receive signals on the channel 190. For example, memory I/O module 160 may be configured to capture (e.g., to sample) data, commands, and addresses from the host 110 via the channel 190 and to output data to the host 110 via the channel 190. Information transmitted across the channel 190 may be stored in registers in the memory I/O module 160 of the memory system 250 as a temporary or short-term storage location prior to longer-term storage in the memory array 175.

The memory system 250 may further include a memory array 175, which may include multiple memory cells (e.g., DRAM memory cells) that store information. The host 110 may read data stored in the memory array 175 and write data into the memory array 175 via the channel 190. Moreover, the memory array 175 may be configured to store metadata such as ECCs (e.g., system or array ECCs) associated with the stored data.

Operations according to some embodiments of this disclosure for storing and retrieving information from memory array 175 may be performed by controlling signals on individual lines of the channel 190. Example embodiments of signaling for a write operation are shown and described with reference to FIG. 3A and FIG. 3B. Example embodiments of signaling for a read operation are shown and described with reference to FIG. 4A and FIG. 4B.

Figure 3A:
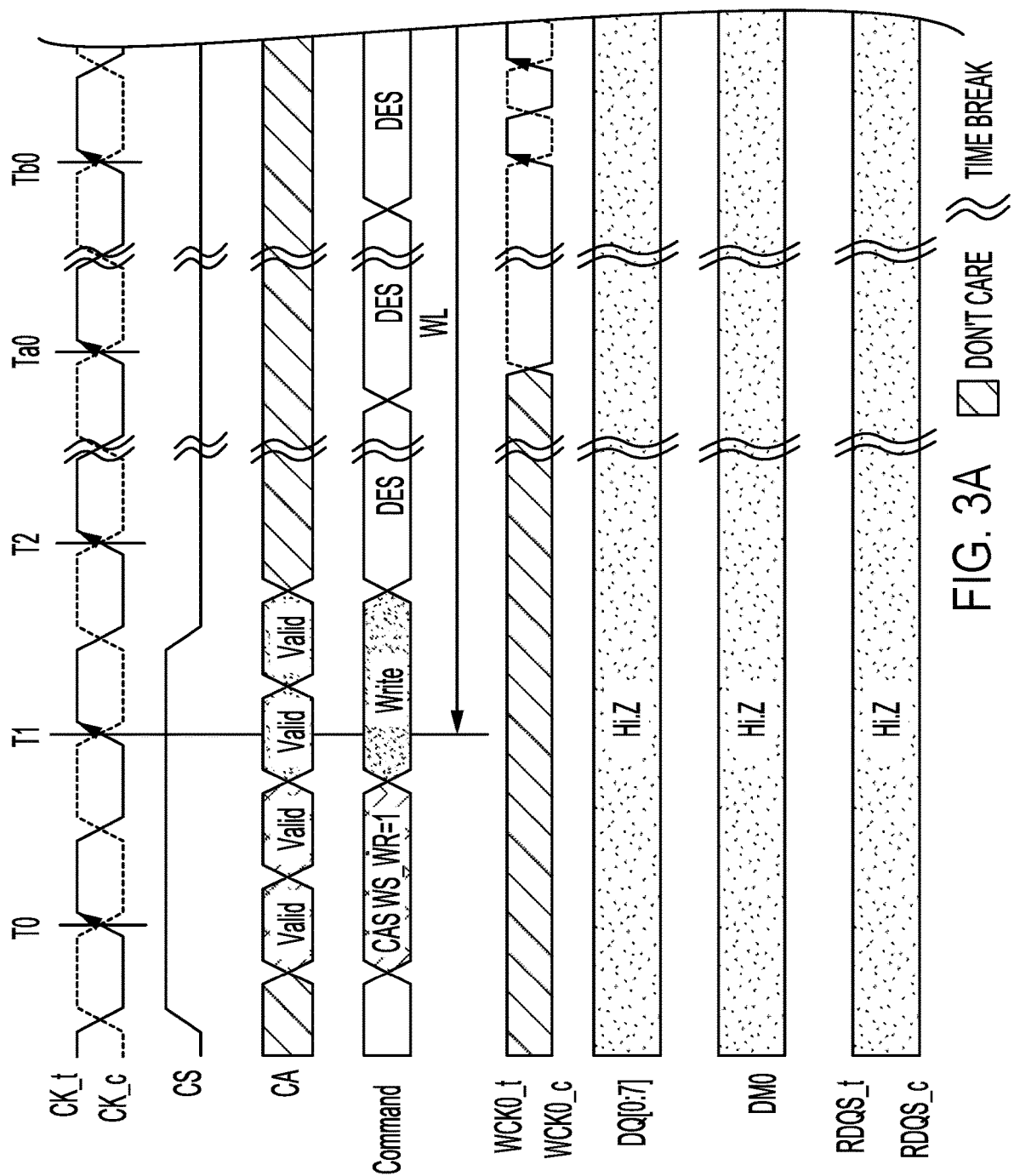
FIG. 3A and FIG. 3B illustrate waveforms for transfer of data through an example channel in a read operation in accordance with certain aspects of the present disclosure.
Figure 3B:
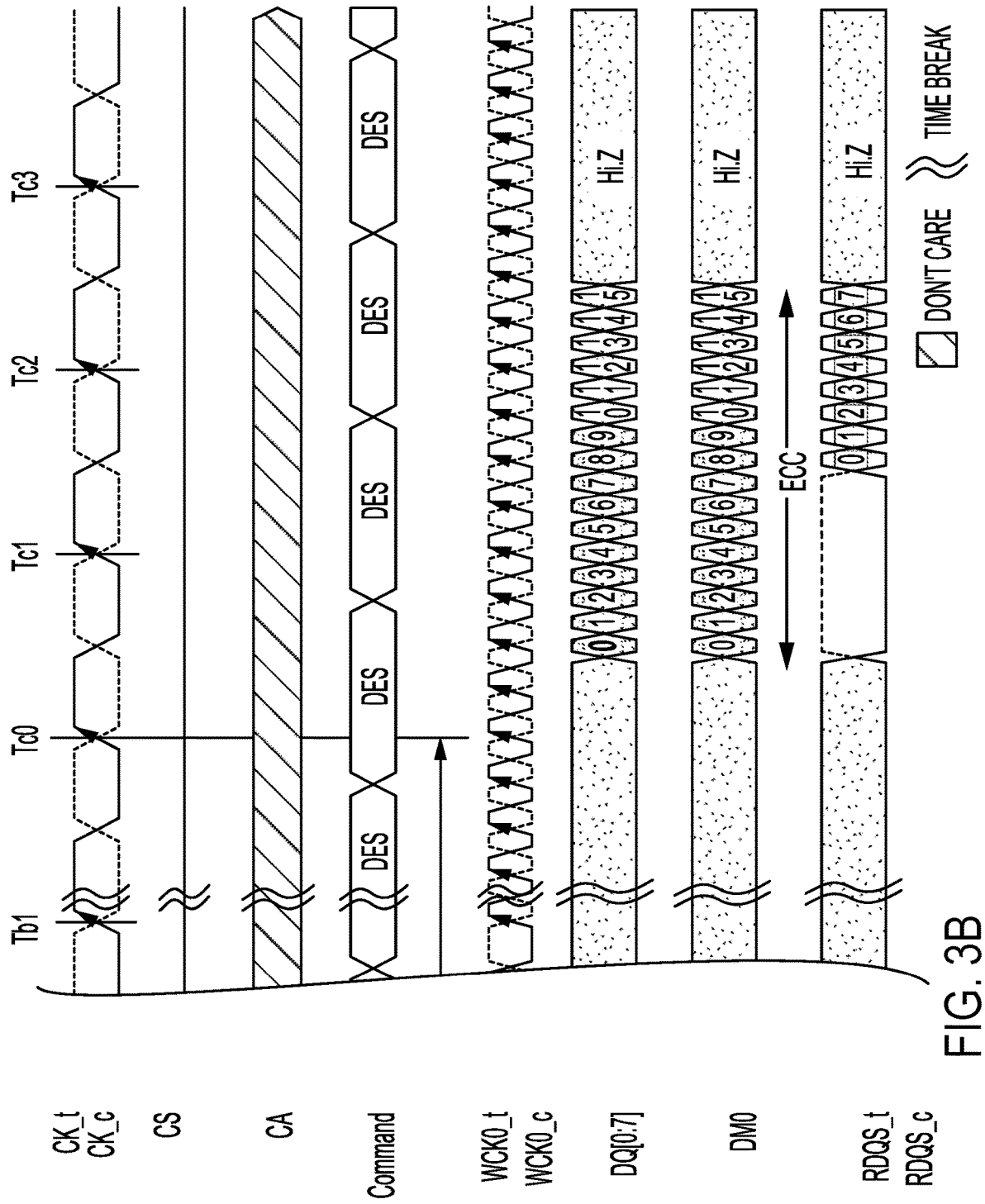

FIG. 3A and FIG. 3B illustrate waveforms of transfer of data through an example channel in a write operation in accordance with certain aspects of the present disclosure. The command and address clock, CK, may be a differential signal having CK_t and CK_c signal connections. The data clock WCK may be a differential signal having WCK0_t and WCK0_c signal connections. The read data strobe RDQS may be a differential signal having RDQS_t and RDQS_c signal connections. The data mask is labeled DM0 to indicate that DM0 corresponds to a lower byte of DQs (DQ[0:7]). At T0 (rising edge of CK_t and falling edge of CK_c), a CAS command may be provided by the host 110 for a write operation to the memory system 250. At T1, a write command may be provided by the host 110 to the memory system 250.

After a time period write latency (WL), the host 110 may toggle the data clock WCK0_t and WCK0_c to provide the memory system 250 with clocking for receiving data for write, on the DQ signal connections. At Tc0-Tc2, the memory system 250 may receive 16 bytes of data serially, on each of the DQ[0:7] signal connections and clocked by the data clock WCK0_t and WCK0_c. The memory system 250 may receive 16 bits of the data mask DM0 serially (e.g., based on the data clock WCK0_t and WCK0_c) to mask certain portions of the received data from the write operation. In some examples, the 16 bytes of data and 16 bits of the data mask DM0 may be received by the memory system 250, with each bit of the data mask DM0 masking a corresponding byte of the received data. At Tc0-Tc2, the RDQS_t signal connection may be a Hi-Z condition. In a read operation, the RDQS_t signal connection may be configured to provide a read data strobe (RDQS) from the memory system 250 to the host 110

Figure 4A:
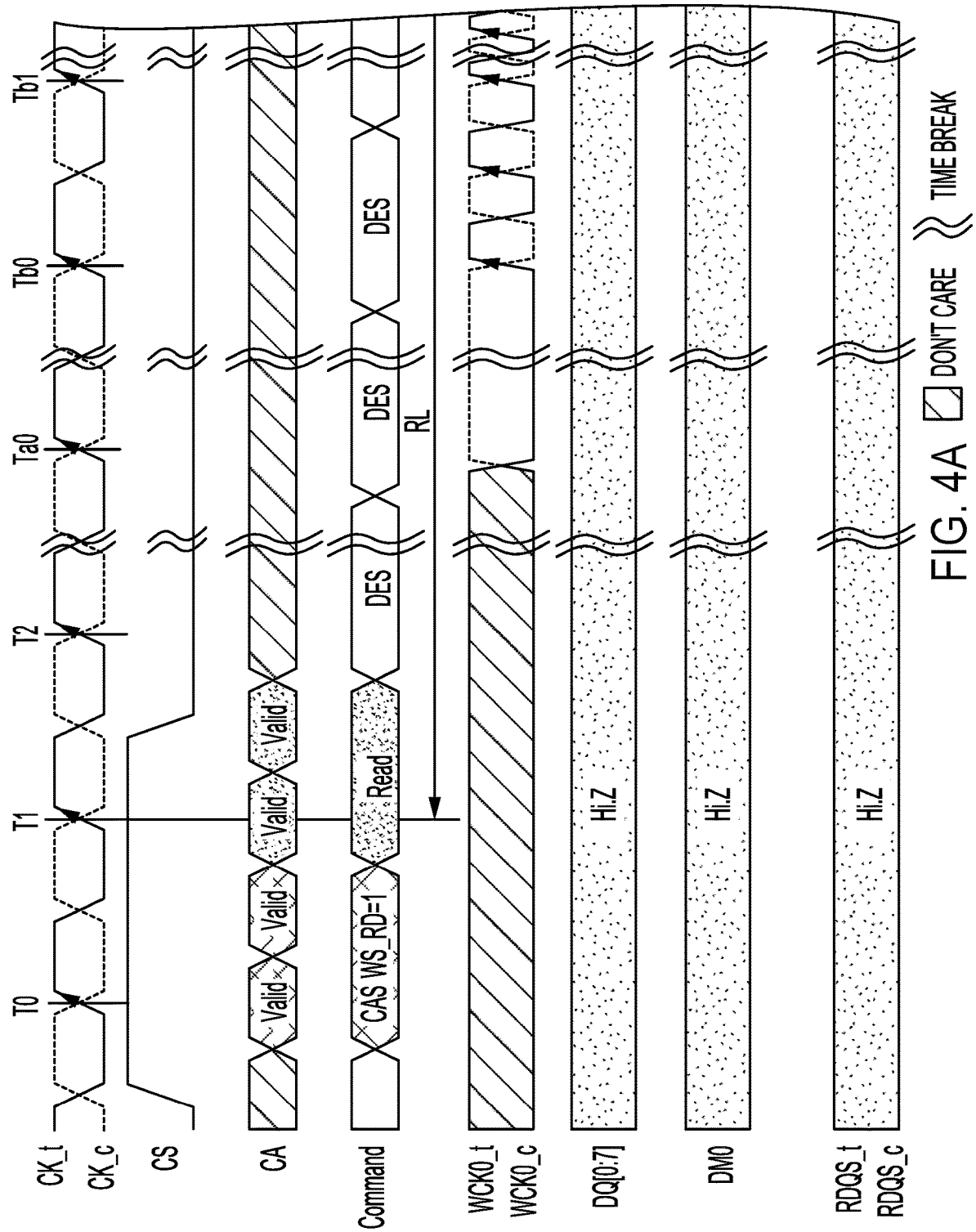
FIG. 4A and FIG. 4B illustrate waveforms for transfer of data through an example channel in a read operation in accordance with certain aspects of the present disclosure.
Figure 4B:
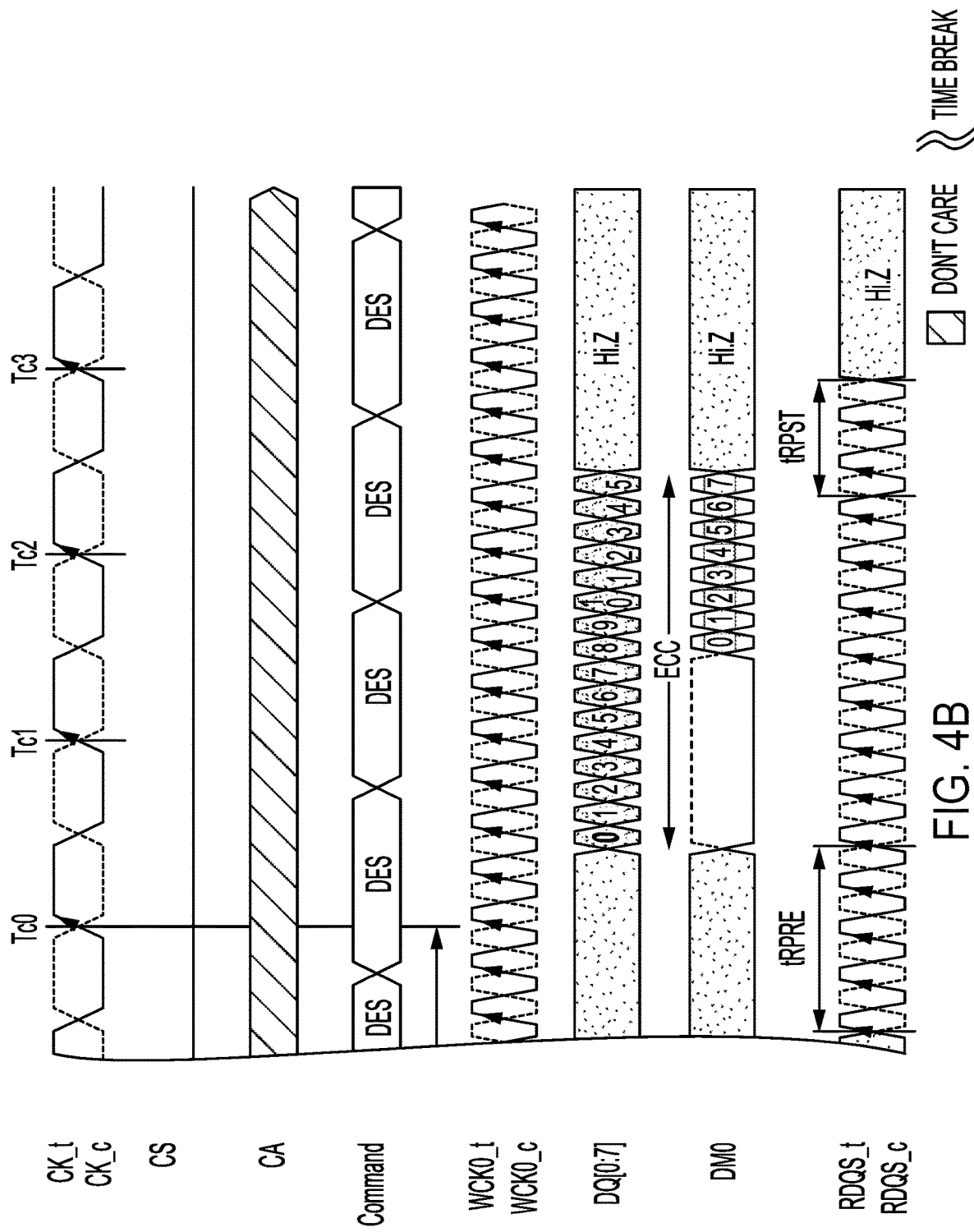

FIG. 4A and FIG. 4B illustrate waveforms for transfer of data through an example channel in a read operation in accordance with certain aspects of the present disclosure. The command and address clock, CK, may be a differential signal having CK_t and CK_c signal connections. The data clock WCK may be a differential signal having WCK0_t and WCK0_c signal connections. The read data strobe RDQS may be a differential signal having RDQS_t and RDQS_c signal connections. The data mask is labeled DM0 to indicate that DM0 corresponds to a lower byte of DQs (DQ[0:7]). At T0 (rising edge of CK_t and falling edge of CK_c), a CAS command may be provided by the host 110 for a read operation to the memory system 250. At T1, a read command may be provided by the host 110 to the memory system 250.

After a time period read latency (RL), the memory system 250 may toggle the read data strobe RDQS to provide the host 110 with clocking to receive data for the read operation on the DQ signal connections. At Tc0-Tc2, the host 110 may receive 16 bytes of data serially, on each of the DQ[0:7] signal connections and clocked by the read data strobe RDQS_t and RDQS_c. Thus, in the example, 16 bytes of data are received by the host 110.

At Tc0-Tc2, the data mask DM0 signal connection may be in a Hi-Z condition. In a write operation, the DM signal connection may be configured to provide a data mask from the host 110 to the memory system 250, which is clocked by WCK0_t and WCK0_c.

Figure 5A:
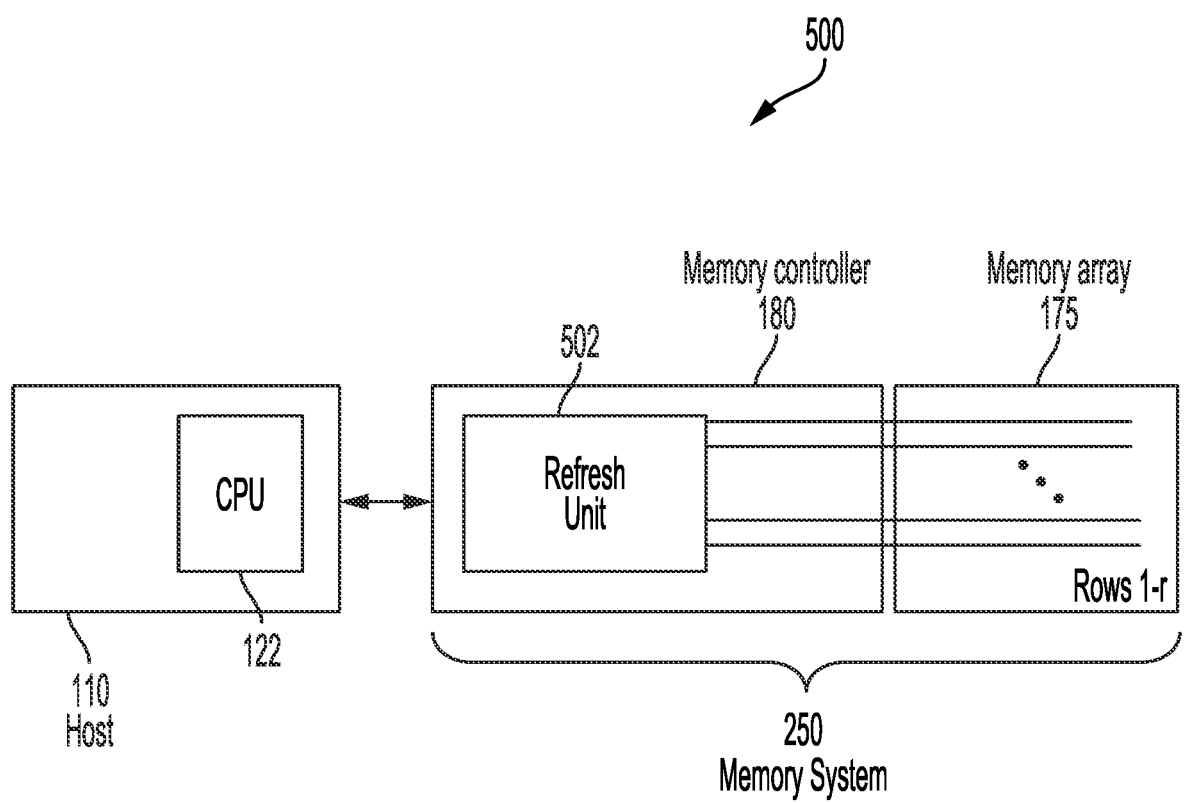
FIG. 5A is a block diagram illustrating aspects of a system supporting partial row refresh according to some embodiments of the disclosure.

An example system supporting partial row refresh operations for the memory array 175 of memory system 250 is shown in FIG. 5A. FIG. 5A is a block diagram illustrating aspects of a system 500 supporting partial row refresh operations for a memory array according to some embodiments of the disclosure. The memory array 175 of the memory system 250 may be organized with a plurality of rows, with each row having a corresponding address. Each of the rows may have a plurality of memory cells, or blocks, with each memory cell assigned to a separate column. The memory controller 180 may be configured to perform refresh operations on the memory array 175 on a row-by-row basis. Conventionally, this includes cycling through each row of the plurality of rows and refreshing the information stored in that row. As one particular example, in a partial array self-refresh mode, when the host 110 enters a sleep state, the memory controller 180 may be configured to refresh entire banks and/or entire rows of the memory array 175. Such refreshing may be performed by activating a sense amplifier connected to each column of a row of the memory array 175 to refresh a block corresponding to the row and the column. For example, a sense amplifier corresponding to each column of a row of the memory array 175 may be activated to sense and/or read a block of the row located in the column corresponding to the sense amplifier. The memory array 175 may not be completely filled with data. In some cases, every row of the memory array 175 may not be completely filled with data. For example, one or more rows of the memory array 175 may include one or more blocks that are not filled with data. Thus, refreshing an entirety of every row in a partial array self-refresh mode may result in unnecessarily refreshing portions of rows that do not store data, thereby wasting power. In particular, activating sense amplifiers corresponding to blocks of a row of the memory array 175 that do not store data may waste power.

The memory controller 180 may include a refresh unit 502 configured to perform at least some refresh operations for the memory array 175. For example, the refresh unit 502 may be configured to perform partial row refresh within the memory array 175 based on partial row refresh information. The partial row refresh information may be stored in the refresh unit 502. For example, address information including partial row refresh information may be stored by the refresh unit 502 and may be used to determine a portion of a row, such as twenty-five percent, fifty percent, seventy-five percent, one-hundred percent, or another amount, of a particular row indicated by the address information, to refresh. Such refresh operations may, for example, be performed from left to right, such that a first twenty-five percent of the row from the left to the right may be refreshed if the partial row refresh information indicates twenty-five percent of the row should be refreshed. Other patterns of refreshing rows based on partial row refresh information may be used. In some embodiments, the partial row refresh information may be stored elsewhere by the memory controller 180, such as in a cache of the memory controller 180 or in the memory array 175 and may be accessed by the refresh unit 502. The partial row refresh information may be populated by obtaining such information from the host 110 and/or accessing a memory location corresponding to the partial row refresh information.

Figure 5B:
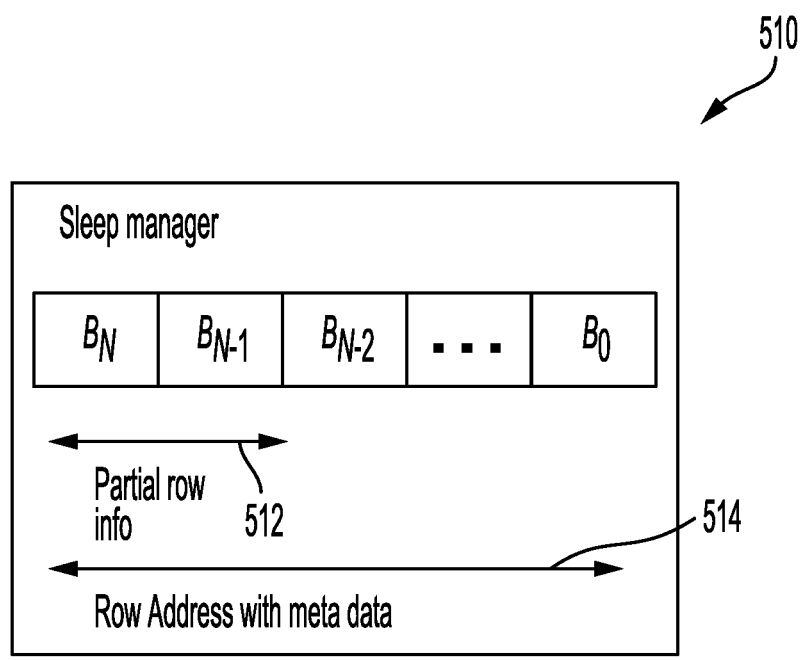
FIG. 5B is a block diagram of a sleep manager supporting partial row refresh according to some embodiments of the disclosure.

The CPU 122 of the host 110 may execute a sleep manager, such as sleep manager 510 shown in FIG. 5B, that tracks partial row refresh information and row address information. FIG. 5B is a block diagram illustrating an example sleep manager 510 executed by a processor of a host device to support partial row refresh operations according to some embodiments. In some embodiments, the sleep manager 510 may execute as a kernel-level process in an operating system executing on the CPU 122. In some embodiments, the sleep manager 510 may execute in firmware on hardware circuitry within the host 110.

Row address information 514 including metadata for one or more rows of the memory array 175 may be stored by the sleep manager 510. The address information 514 may, for example, include partial row refresh information 512 for each row. Thus, address information 514 for each row of the memory array 175 stored by the sleep manager 510 may include an address of each respective row and respective partial row refresh information 512 indicating an amount of each row used to store data.

Figure 5C:
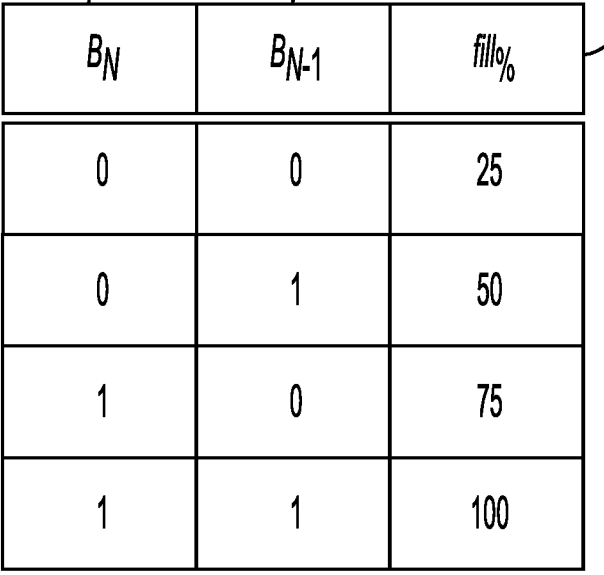
FIG. 5C is a chart of example values of partial row refresh information according to some embodiments of the disclosure.

In some embodiments, the partial row refresh information 512 may include two bits of the row address information 514. An example table showing example values of partial row information 512 corresponding to example portions of a row to be refreshed is shown in the table 520 of FIG. 5C. Example values of a first bit are shown in the first column 522, and example values of a second bit are shown in a second column 524. Example percentages of a row filled with data to be refreshed are shown in the third column 526. For example, if a value of a first bit of the partial row refresh information 512 for a row is 0 and a value of a second bit of the partial row refresh information 512 for a row is 0, a percentage of the row filled with data may be less than or equal to twenty-five percent. As another example, if a value of a first bit of the partial row refresh information 512 for a row is 0 and a value of a second bit of the partial row refresh information 512 for a row is 1, a percentage of the row filled with data may be greater than twenty-five percent and less than or equal to fifty percent. As another example, if a value of a first bit of the partial row refresh information 512 for a row is 1 and a value of a second bit of the partial row refresh information 512 for a row is 0, a percentage of the row filled with data may be greater than fifty percent but less than seventy-five percent. As another example, if a value of a first bit of the partial row refresh information 512 for a row is 1 and a value of a second bit of the partial row refresh information 512 for a row is 1, a percentage of the row filled with data may be greater than seventy-five percent and less than or equal to one-hundred percent. In some embodiments, the partial row refresh information 512 may include fewer or greater than two bits corresponding to fewer or more than four row usage percentages. In some embodiments, other indications of row usage may be included in the partial row information 512, such as a value corresponding to each block of the row used to store data.

The sleep manager 510 may generate the partial row refresh information 512 and/or row address information 514 upon storage of data in the memory array 175. For example, the sleep manager 510 may generate address information 514 and/or partial row information 512 for a row when data is stored in the row based on an amount of data stored in the row.

For example, the CPU 122 may be configured to detect a triggering event for activating a partial row refresh memory mode. The triggering event may be based on a counter that determines that the host 110 has been in a low power mode (e.g., sleep mode) for a predetermined amount of time. The triggering event may be based on the host 110 being in a location that indicates that the host 110 may be in a sleep mode for an extended period of time. Such a location may be, for example when the host 110 is an automobile, a parking garage at an airport. The triggering event may be a user input in which the user indicates that the host 110 should enter sleep mode, such as by depressing a power button.

As one example, if the host 110 is integrated into an automobile, the CPU 122 may determine from the location data that the host 110 is located in a parking garage or in a car rental lot, which indicates that the host 110 will not be in use for an extended period of time. Accordingly, once the CPU 122 determines that the host 110 is in the parking garage or the car rental lot, the CPU 122 may store data in the memory array 175, may generate partial row refresh information 512 and/or row address information 514, may transmit the partial row refresh information 512 and/or row address information 514 to the memory system 250 and cause the memory system 250 to enter into the partial row refresh memory mode.

Figure 5D:
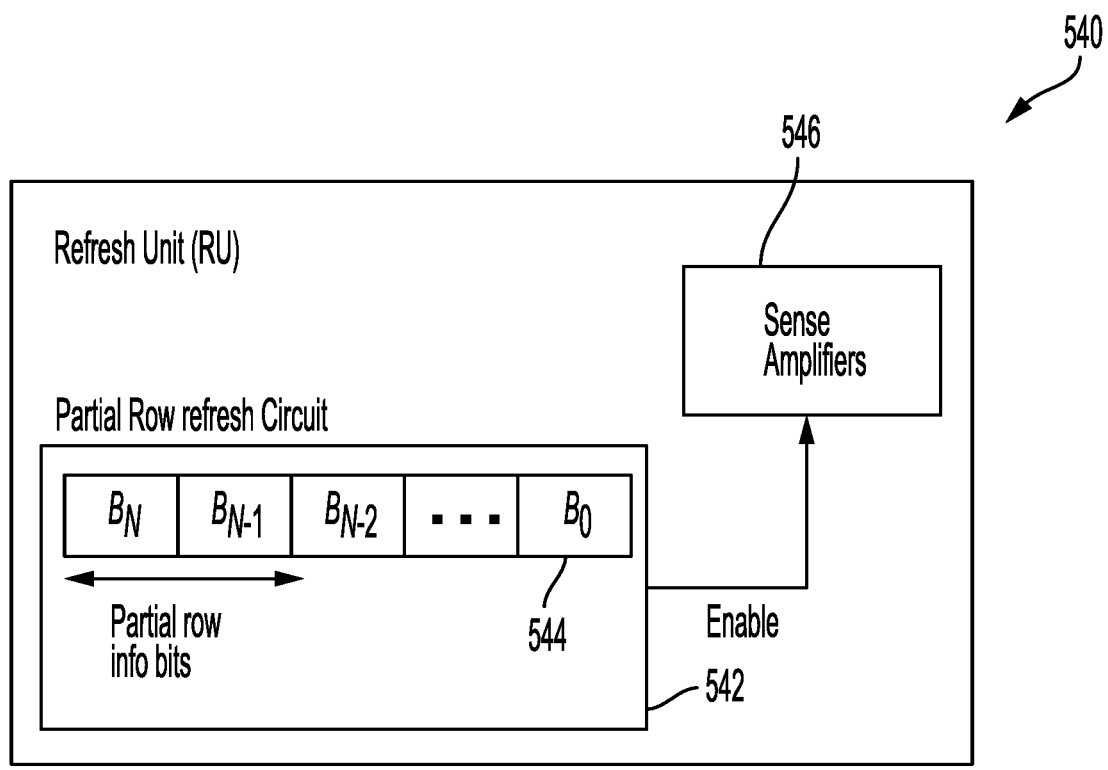
FIG. 5D is a block diagram of a refresh unit supporting partial row refresh according to some embodiments of the disclosure.

A block diagram of an example refresh unit 540, such as refresh unit 502 of FIG. 5A, is shown in FIG. 5D. The refresh unit 540 may include a partial row self-refresh circuit 542. The partial row self-refresh circuit 542 may be configured to receive partial row refresh information, such as address information including partial row refresh information 544 and to decode the partial row refresh information to activate refreshing for a portion of a row indicated by the partial row refresh information. In some embodiments, the partial row refresh information may be received by the refresh unit 540 directly from the CPU 122, or may be stored by the memory controller 180 and accessed by the partial row refresh circuit 542. The partial row refresh circuit 542 may activate one or more sense amplifiers 546 corresponding to blocks of a row of the memory array 175 based on partial row refresh information decoded by the partial row refresh circuit 542. For example, if the partial row refresh information for a particular row indicates that up to twenty-five percent of the row is storing data, the partial row refresh circuit 542 may activate sense amplifiers 546 corresponding to the first twenty-five percent of the row, such as a first twenty-five percent of blocks or columns of the row to refresh the corresponding blocks of the row.

Figure 5E:
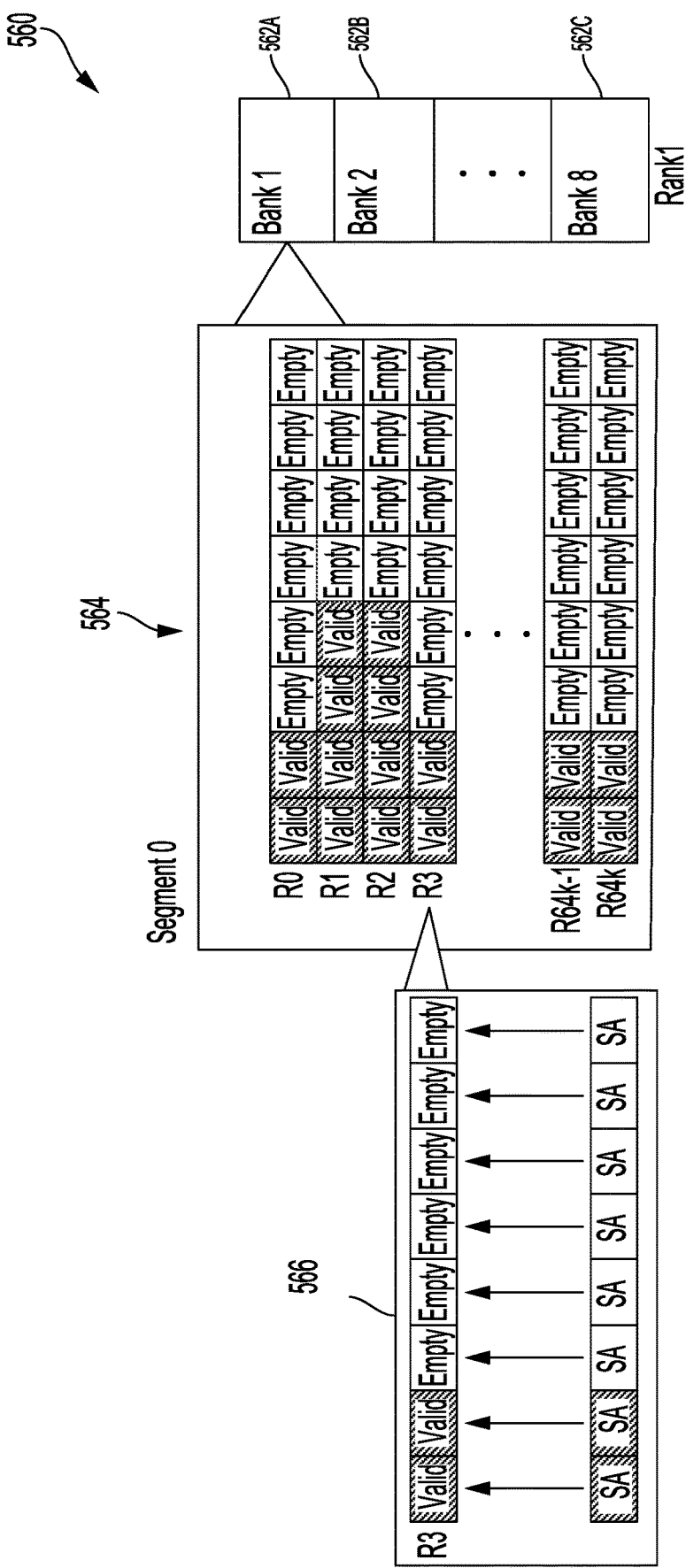
FIG. 5E is a block diagram of a partial row refresh operation on a memory bank according to some embodiments of the disclosure.

For example, as shown in FIG. 5E, a partial row refresh operation may be performed by the refresh unit 502 on a row of the memory array 175. An example block diagram 560 of a partial row refresh operation performed on the memory array 175 is shown in FIG. 5E. The memory array 175 may include a first array including eight banks. The eight banks may include a first bank 562A, a second bank 562B, and an eighth bank 562C. The first bank 562A may include a first segment 564. The first segment 564 may include a plurality of rows. Each of the plurality of rows may include a respective plurality of blocks. Different rows may have different numbers of blocks that are empty and different numbers of blocks storing data, such as different numbers of valid blocks. The shaded blocks of each row shown in the first segment 564 may be blocks storing data, or valid blocks. In some embodiments, data may be stored in blocks of a row from left to right. Thus, if twenty-five percent of blocks of a row store data, the twenty-five percent of blocks of the row storing data may be a first twenty-five percent of blocks of a row storing data from left to right.

An example row 566 of the first segment 564 may include two blocks storing data and six blocks not storing data. Thus, for example, the sleep manager 510 shown in FIG. 5B executed by the CPU 122 may generate address information including partial row refresh information for the example row 566 indicating that twenty-five percent of the example row 566 is storing data, after the data is stored in the row. The sleep manager 510 may transmit the address information including the partial row refresh information to the memory controller 180. In some embodiments, the memory controller 180 may store the address information including the partial row refresh information and/or provide the address information including the partial row refresh information to the refresh unit 502. The refresh unit 502 of the memory controller 180, which may correspond to the refresh unit 540 of FIG. 5D, may decode the address information to determine that twenty-five percent of the row 566 is storing data. The refresh unit 502 may activate sense amplifiers, shown as SAs in FIG. 5E, corresponding to the first twenty-five percent of the blocks of the example row 566, such as two sense amplifiers corresponding to the first two blocks of the example row 566, to refresh the blocks storing data based on the partial row refresh information. The remaining six sense amplifiers, corresponding to the next six blocks of the example row 566, may remain deactivated, using less power than if all sense amplifiers for the example row 566 were activated. Similar refresh operations may be performed on other rows, segments, and/or banks of the memory array 175 based on partial row refresh information corresponding to the rows. In some embodiments, the refresh unit 502 may refresh banks and/or rows of banks in a round robin sequence.

Figure 6:
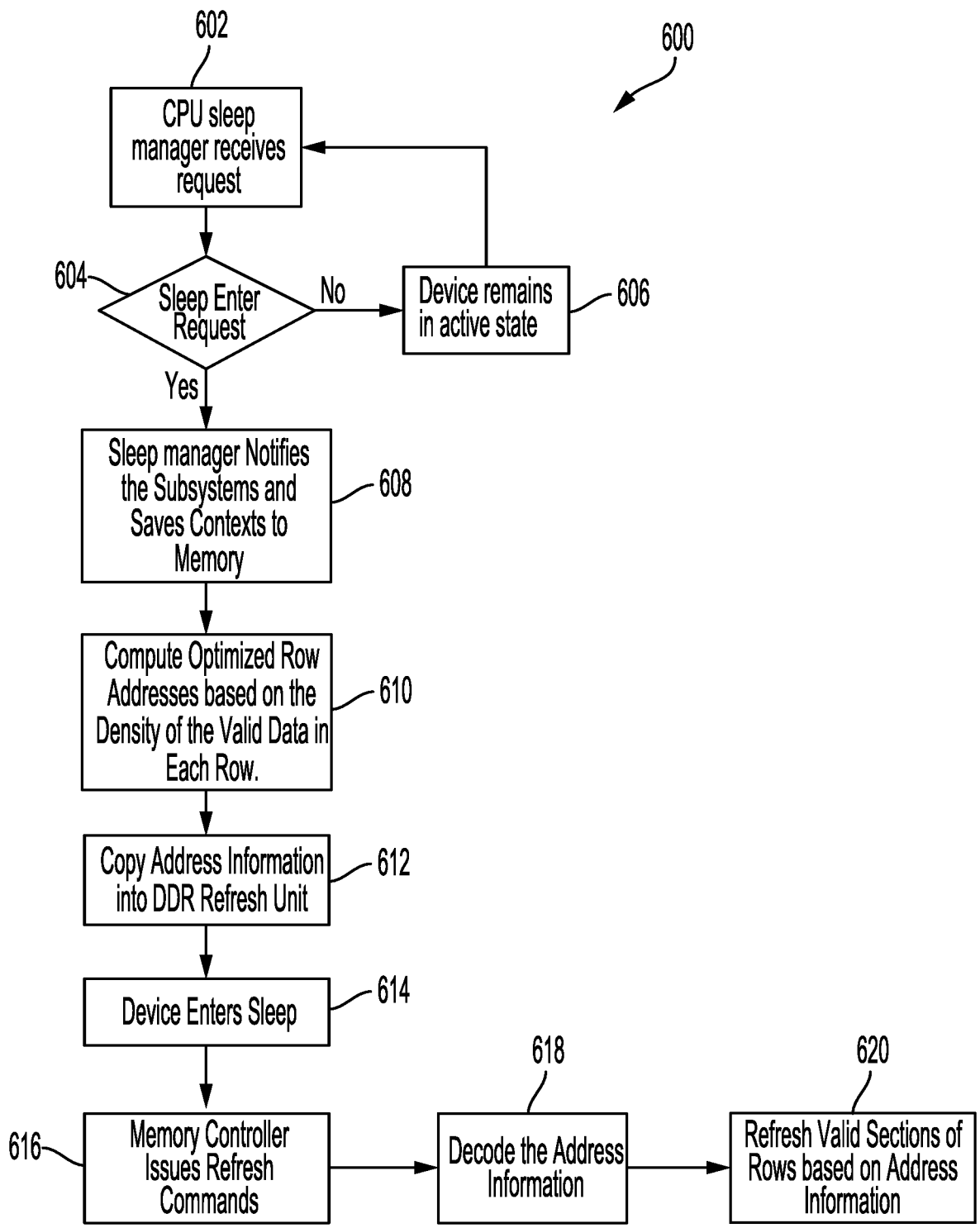
FIG. 6 is an example flow chart illustrating execution of partial row refresh according to some embodiments of the disclosure.

The memory system 250 may be configured for partial row refresh operation by the CPU 122 based on a power state of host device 110. FIG. 6 is an example flow chart illustrating execution of partial row refresh according to some embodiments of the disclosure. A method 600 begins, at block 602 with receipt of a request by a sleep manager of a CPU. At block 604, the sleep manager determines whether the request is a sleep enter request or another request. If the request is not a sleep enter request, the CPU may, at block 606, remain in an active state and may continue processing requests at block 602.

If the request is determined to be a sleep enter request at block 604, the sleep manager may, at block 608, notify one or more subsystems of the sleep enter request and may save one or more contexts to a memory. For example, the sleep manager may save data, such as context data for one or more applications or system processes, to one or more blocks of one or more rows of a memory array of a memory system.

At block 610, the sleep manager may compute optimized row addresses based on the density of valid data in each row. Such computing may, for example, include determining an amount of data stored in each row and generating partial row refresh information based on the amount of data stored in each row. The partial row refresh information for each respective row may be appended to an address for each respective row, such as by adding one or more bits of partial row refresh information to a beginning or an end of an address of each respective row. Thus, computed row addresses may include partial row refresh information corresponding to the row address in addition to the address of the row.

At block 612, the sleep manager may copy the address information, such as the optimized row address information including the partial row refresh information, into a refresh unit of the memory system. The memory system may be a DDR memory system, and the refresh unit may be a DDR refresh unit. In some embodiments, the address information may be transmitted to a memory controller of the memory system and stored by the memory controller for access by the refresh unit.

At block 614, the host device may enter a sleep state. For example, a CPU of the host device may enter a sleep state. When sleep state is entered, an instruction may be sent to the memory controller of the memory system to enter a refresh mode, such as a partial array self-refresh mode including partial row refresh operations, applicable during the sleep mode. For example, a self-refresh command may be sent to the memory system. In some embodiments, the instruction may include an indication that partial row refresh should be performed based on the partial row refresh information copied in the address information at block 612. In some embodiments, the instruction may be specific for a partial row self-refresh mode. While in the partial row self-refresh mode, the memory controller issues refresh commands to the memory array of the memory system at block 616 to maintain the contents of the memory (e.g., the context data). The refresh commands may be from either the memory controller on the host device or the memory controller on the memory system. The refresh command causes a refresh unit at block 618 to decode the address information including the partial row refresh information. At block 620, portions of rows are refreshed based on the decoded address information, such as based on the partial row refresh information. As discussed herein a portion of a row or a partial row may be less than or equal to an entire row.

Figure 7:
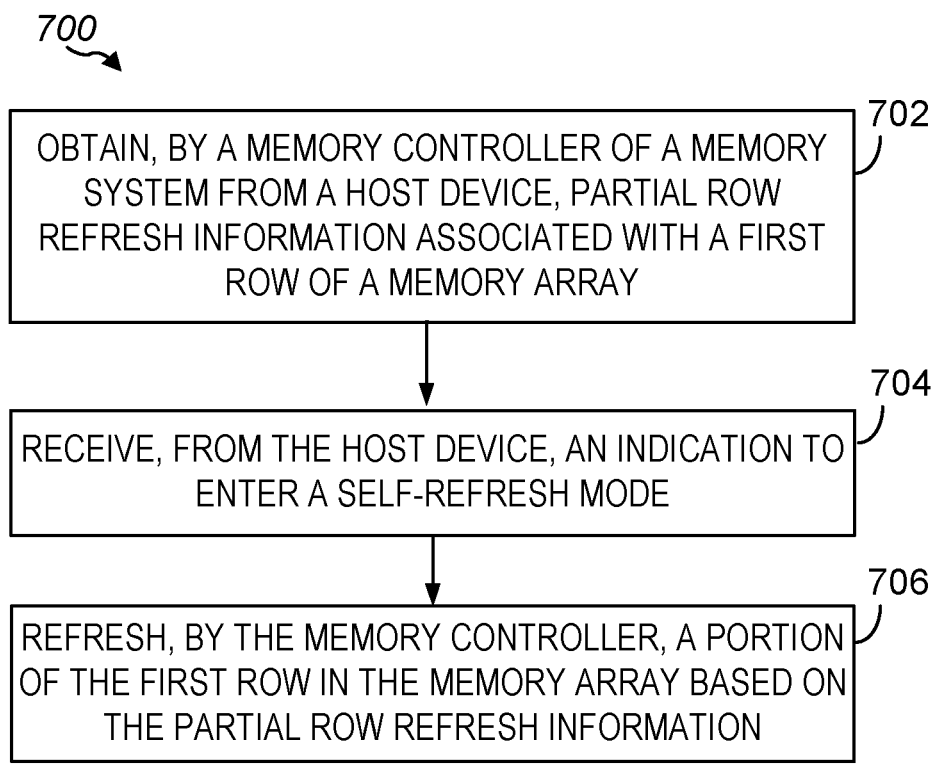
FIG. 7 is a flow chart illustrating a memory system operating to perform partial row refresh operations according to some embodiments of the disclosure.

FIG. 7 is a flow chart illustrating performing partial refresh operations by a memory system according to some embodiments of the disclosure. The method 700 may, for example, be performed by a memory controller of a memory system. The memory controller may be coupled to a memory array through a data bus and configured to access data stored in the memory array through the data bus. The memory array may be a low power double data rate (LPDDR) memory array. The memory controller may be configured to couple to a host device through a channel and to perform the operations of the method 700. A method 700 begins, at block 702, with obtaining (e.g., by receiving) by a memory controller of a memory system from a host device, partial row refresh information associated with a first row of a memory array. The partial row refresh information may be received by the memory controller 180 of the memory system 250 through channel 190 from the memory controller 130 of the host 110. The partial row refresh information may be received as part of a command transmitted on the COMMAND & ADDRESS CA bus of channel 190. The partial row refresh information may alternatively be received as part of data transmitted on the DQ bus of channel 190. The partial row refresh information may, for example, include an indication of a percentage of the first row to be refreshed. In some embodiments, the partial row refresh information may include a two bit value. In some embodiments, the partial row refresh information may include an indication to refresh twenty-five percent of the first row, an indication to refresh fifty percent of the first row, an indication to refresh seventy-five percent of the first row, or an indication to refresh one-hundred percent of the first row. The partial row refresh information may, for example, be included in address information associated with the first row. For example, address information for the first row may include partial row refresh information for the first row and an address of the first row. In some embodiments, at block 702, partial row refresh information, such as partial row refresh information included in address information, may be received for multiple rows of the memory array.

At block 704, the memory controller receives an indication to enter a self-refresh mode. The indication to enter the self-refresh mode may, for example be an indication that the host device is entering a sleep mode. The indication may cause the memory controller 180 to assume responsibility for refreshing the memory array 175 without further input from the host 110 until a new instruction changing the refresh mode is received. The indication to enter the self-refresh mode may take the format of an instruction for the memory system 250 to enter a certain sleep mode that allows the host 110 to enter sleep mode.

In some embodiments, the operations of block 702 and block 704 may be performed by a single operation. For example, a command to initiate a partial row self-refresh operation may include the partial row refresh information. As another example, an indication to enter the self-refresh mode may include the partial row refresh information.

At block 706, the memory controller refreshes a portion of the first row in the memory array based on the partial row refresh information. For example, the memory controller may determine a portion of the first row to be refreshed based on the partial row refresh information. Determining the portion of the first row to be refreshed based on the partial row refresh information may, for example, include decoding the partial row refresh information. Based on the partial row refresh information, such as based on a determined portion of the first row to be refreshed, the memory controller may then activate one or more sense amplifiers corresponding to one or more blocks of the first row. For example, sense amplifiers corresponding to a particular percentage of blocks of the row indicated by the partial row refresh information may be activated to refresh the blocks. The refresh may be performed by logic circuitry 162 in memory controller 180, such as a refresh unit 502 of FIG. 5A that generates control signals (e.g., row selection and enable signal). In some embodiments, portions of multiple respective rows of a memory array may be refreshed based on receipt of respective partial row refresh information for the respective rows.

Figure 8:
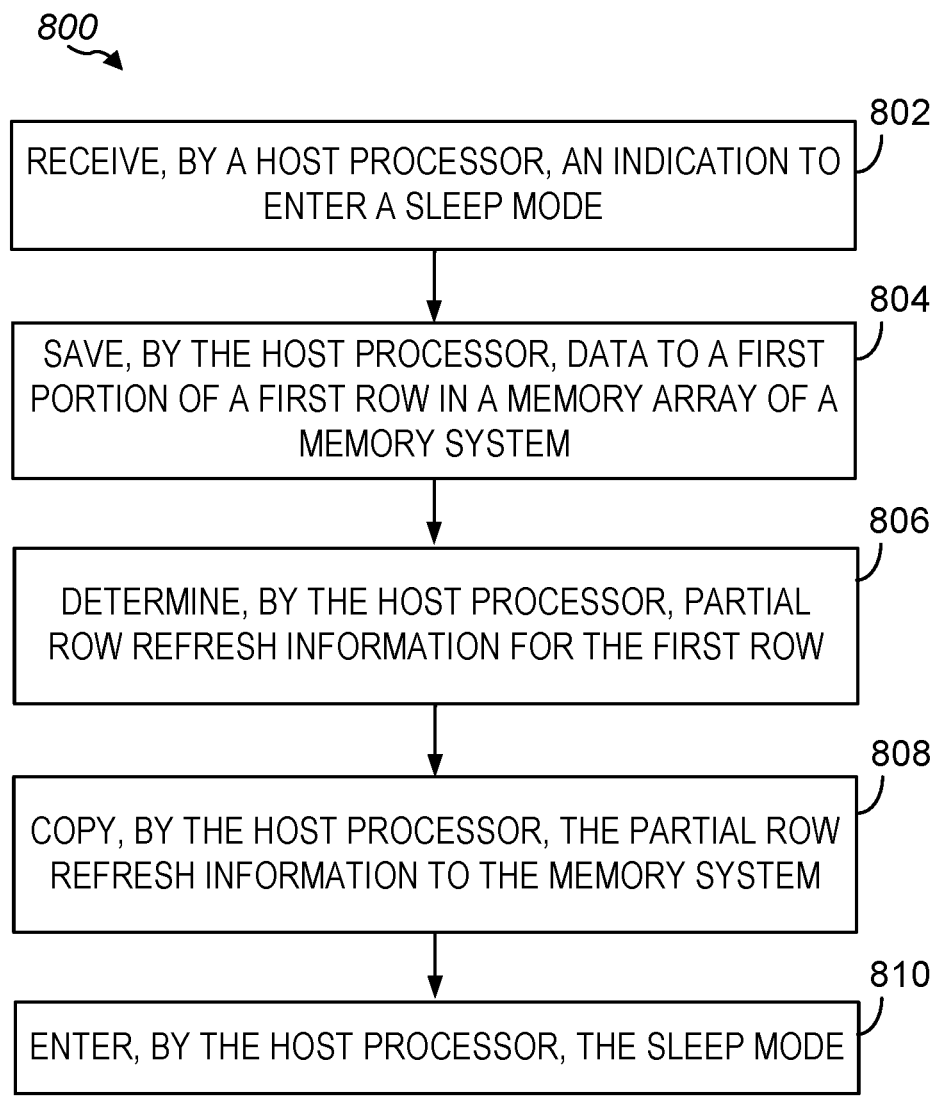
FIG. 8 is a flow chart illustrating a host device operating a memory system to perform partial row refresh operations according to some embodiments of the disclosure.

A host device may configure the memory system for performing the self-refresh operation of FIG. 7. FIG. 8 is a flow chart illustrating a host device operating a memory system to perform a partial row refresh operation according to one or more aspects of the disclosure. A method 800 begins at block 802 with receiving, by a host processor, an indication to enter a sleep mode. The indication may be triggered by information such as a location of the host device, a processing queue of the host device, user input specifying a low-power mode for the host device, and/or a lack of user input to the host device in a predetermined period of time. Although some examples of sleep mode are described, sleep mode may refer to any lower-power state of operation during which the memory system will not be accessed by the host device for a period of time.

At block 804, the host processor may save data to a first portion of a first row in a memory array of a memory system.

The first portion of the first row may be the entire first row less than the entire first row. In some embodiments, the data may be context data. The context data may include application data, user data, register values from a processor core, or the like that indicates a current state of processing by the host device.

At block 806, the host processor determines partial row refresh information for the first row. In some embodiments, partial row refresh information may be determined for multiple rows. Such determination may, for example, be performed in response to saving of data to the first portion of the first row. For example, after saving the data to the first portion of the first row, the host processor may determine an address of the first row and an amount of the first row that is storing the data, such as a percentage of the first row storing the data. The processor may generate partial row refresh information based on the determination of the amount of the first row used for storage of data. The partial row refresh information may be included in address information for the first row. For example, one or more bits of partial row refresh data may be added at a beginning or an end of an address of the row. Thus, determining the partial row refresh information may include determining address information for the first row based on a number of blocks in the first portion of the first row to which the data was saved.

At block 808, the host processor may copy the partial row refresh information to the memory system. For example, address information including the partial row refresh information for the first row may be copied to the memory system. The copy may include storing the partial row refresh information at a particular location in the memory or attaching the partial row refresh information as a data value to a command sent to the memory system, such as a command to update a configuration register or change a mode of the memory system.

At block 810, the host processor may enter a sleep mode. While in the sleep mode, the host processor may rely on the memory system to perform self-refresh operations without input from the host processor. While in the sleep mode, the power consumed by the host device is reduced by reduction of the operating system of the host processor to a lower voltage, lower frequency, deeper sleep state, and/or power-gating portions or all of the host processor. The host processor may later receive a trigger to exit the sleep mode. When exiting from the sleep mode, the host processor may transmit a command to the memory system to exit the partial row self-refresh mode of operation for the host processor to resume handling refresh operations.

A wireless communications device may include a memory system as illustrated in at least FIG. 1 and FIG. 2 and configured to receive and output data from the memory array and refresh portions of rows of the memory array based on partial row refresh information. The memory system according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, or avionics systems.

In one or more aspects, techniques for memory storage and retrieval may include additional aspects, such as any single aspect or any combination of aspects described below or in connection with one or more other processes or devices described elsewhere herein. In a first aspect, supporting data operations may include an apparatus configured to perform operations including obtaining, from a host device through a first channel, partial row refresh information associated with a first row in a memory array and refreshing a portion of the first row in the memory array based on the partial row refresh information.

Additionally, the apparatus may perform or operate according to one or more aspects as described below. In some implementations, the apparatus includes a wireless device, such as a UE. In some implementations, the apparatus includes a remote server, such as a cloud-based computing solution, which receives image data for processing to determine output image frames. In some implementations, the apparatus may include at least one processor, and a memory coupled to the processor. The processor may be configured to perform operations described herein with respect to the apparatus. In some other implementations, the apparatus may include a non-transitory computer-readable medium having program code recorded thereon and the program code may be executable by a computer for causing the computer to perform operations described herein with reference to the apparatus. In some implementations, the apparatus may include one or more means configured to perform operations described herein. In some implementations, a method of wireless communication may include one or more operations described herein with reference to the apparatus.

In a second aspect, in combination with the first aspect, the partial row refresh information includes an indication of a percentage of the first row to be refreshed.

In a third aspect, in combination with one or more of the first aspect or the second aspect, the indication of the percentage of the first row to be refreshed includes a two bit value.

In a fourth aspect, in combination with one or more of the first aspect through the third aspect, the indication of the percentage of the first row to be refreshed comprises one of: an indication to refresh twenty-five percent of the first row, an indication to refresh fifty percent of the first row, an indication to refresh seventy-five percent of the first row, or an indication to refresh one-hundred percent of the first row.

In a fifth aspect, in combination with one or more of the first aspect through the fourth aspect, the apparatus is further configured to perform operations comprising: receiving, from the host device, an indication to enter a self-refresh mode, wherein after receiving the indication to enter the self-refresh mode, the memory controller performs the refreshing of a portion of the first row in the memory array based on the partial row refresh information.

In a sixth aspect, in combination with one or more of the first aspect through the fifth aspect, receiving the indication to enter the self-refresh mode comprises receiving an indication of the host device entering a sleep mode.

In a seventh aspect, in combination with one or more of the first aspect through the sixth aspect, the partial row refresh information is comprised in address information associated with the first row.

In an eighth aspect, in combination with one or more of the first aspect through the seventh aspect, refreshing, by the memory controller, a portion of the first row in the memory array based on the partial row refresh information comprises: determining a portion of the first row to be refreshed based on the partial row refresh information and activating one or more sense amplifiers corresponding to one or more blocks of the first row based on the portion of the first row to be refreshed.

In a ninth aspect, in combination with one or more of the first aspect through the eighth aspect, determining the portion of the first row to be refreshed comprises decoding the partial row refresh information.

In a tenth aspect, in combination with one or more of the first aspect through the ninth aspect, the memory array comprises a low power double data rate (LPDDR) memory array.

In an eleventh aspect, the apparatus may be configured to perform operations including saving data to a first portion of a first row in a memory array of a memory system through a memory controller, determining partial row refresh information for the first row based on the saving of data to the first portion of the first row, and copying, through the memory controller, the partial row refresh information to the memory system.

In a twelfth aspect, in combination with the eleventh aspect, the apparatus may be further configured to perform operations including receiving an indication to enter a sleep mode, wherein saving the data is performed after receiving the indication to enter the sleep mode, transmitting an indication to enter a self-refresh mode to the memory system through the memory controller after receiving the indication to enter the sleep mode, and entering the sleep mode after copying the partial row refresh information to the memory system.

In a thirteenth aspect, in combination with one or more of the eleventh aspect through the twelfth aspect, determining the partial row refresh information comprises determining address information for the first row based on a number of blocks in the first portion of the first row.

In a fourteenth aspect, in combination with one or more of the eleventh aspect through the thirteenth aspect, the partial row refresh information includes an indication of a percentage of the first row to be refreshed.

In a fifteenth aspect, in combination with one or more of the eleventh aspect through the fourteenth aspect, the memory controller is configured to communicate with a double data rate (DDR) memory system.

In the description of embodiments herein, numerous specific details are set forth, such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present disclosure. However, it will be apparent to one skilled in the art that these specific details may not be required to practice the teachings disclosed herein. In other instances, well known circuits and devices are shown in block diagram form to avoid obscuring teachings of the present disclosure.

Some portions of the detailed descriptions which follow are presented in terms of procedures, logic blocks, processing, and other symbolic representations of operations on data bits within a computer memory. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

In the figures, a single block may be described as performing a function or functions. The function or functions performed by that block may be performed in a single component or across multiple components, and/or may be performed using hardware, software, or a combination of hardware and software. To clearly illustrate this interchangeability of hardware and software, various illustrative components, blocks, modules, circuits, and steps are described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example devices may include components other than those shown, including well-known components such as a processor, memory, and the like.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving," "settling," "generating," or the like, refer to the actions and processes of a computer system, or similar electronic computing device, that manipulates and transforms data represented as physical (electronic) quantities within the computer system's registers and memories into other data similarly represented as physical quantities within the computer system's registers, memories, or other such information storage, transmission, or display devices.

The terms "device" and "apparatus" are not limited to one or a specific number of physical objects (such as one smartphone, one camera controller, one processing system, and so on). As used herein, a device may be any electronic device with one or more parts that may implement at least some portions of the disclosure. While the description and examples herein use the term "device" to describe various aspects of the disclosure, the term "device" is not limited to a specific configuration, type, or number of objects. As used herein, an apparatus may include a device or a portion of the device for performing the described operations.

Certain components in a device or apparatus described as "means for accessing," "means for receiving," "means for sending," "means for using," "means for selecting," "means for determining." "means for normalizing," "means for multiplying," or other similarly-named terms referring to one or more operations on data, such as image data, may refer to processing circuitry (e.g., application specific integrated circuits (ASICs), digital signal processors (DSP), graphics processing unit (GPU), central processing unit (CPU)) configured to perform the recited function through hardware, software, or a combination of hardware configured by software.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to FIGS. 1-2 include processors, electronics devices, hardware devices, electronics components, logical circuits, memories, software codes, firmware codes, among other examples, or any combination thereof. Software shall be construed broadly to mean instructions, instruction sets, code, code segments, program code, programs, subprograms, software modules, application, software applications, software packages, routines, subroutines, objects, executables, threads of execution, procedures, and/or functions, among other examples, whether referred to as software, firmware, middleware, microcode, hardware description language or otherwise. In addition, features discussed herein may be implemented via specialized processor circuitry, via executable instructions, or combinations thereof.

Those of skill in the art that one or more blocks (or operations) described with reference to the figures included with this description may be combined with one or more blocks (or operations) described with reference to another of the figures. For example, one or more blocks (or operations) of FIG. 3 may be combined with one or more blocks (or operations) of FIG. 1 or FIG. 2.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits, and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or any conventional processor, controller, microcontroller, or state machine. In some implementations, a processor may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, which is one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, opposing terms such as "upper" and "lower," or "front" and back," or "top" and "bottom," or "forward" and "backward" are sometimes used for ease of describing the figures, and indicate relative positions corresponding to the orientation of the figure on a properly oriented page, and may not reflect the proper orientation of any device as implemented.

As used herein, the term "coupled to" in the various tenses of the verb "couple" may mean that element A is directly connected to element B or that other elements may be connected between elements A and B (i.e., that element A is indirectly connected with element B), to operate certain intended functions. In the case of electrical components, the term "coupled to" may also be used herein to mean that a wire, trace, or other electrically conductive material is used to electrically connect elements A and B (and any components electrically connected therebetween). In some examples, the term "coupled to" mean a transfer of electrical energy between elements A and B, to operate certain intended functions.

In some examples, the term "electrically connected" mean having an electric current or configurable to having an electric current flowing between the elements A and B. For example, the elements A and B may be connected via resistors, transistors, or an inductor, in addition to a wire, trace, or other electrically conductive material and components. Furthermore, for radio frequency functions, the elements A and B may be "electrically connected" via a capacitor.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown, or in sequential order, or that all illustrated operations be performed to achieve desirable results. Further, the drawings may schematically depict one or more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, the term "or," when used in a list of two or more items, means that any one of the listed items may be employed by itself, or any combination of two or more of the listed items may be employed. For example, if a composition is described as containing components A, B, or C, the composition may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof.

The term "substantially" is defined as largely, but not necessarily wholly, what is specified (and includes what is specified; for example, substantially 90 degrees includes 90 degrees and substantially parallel includes parallel), as understood by a person of ordinary skill in the art. In any disclosed implementations, the term "substantially" may be substituted with "within [a percentage] of" what is specified, where the percentage includes 0.1, 1, 5, or 10 percent.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An apparatus, comprising:
   a memory controller coupled to a memory array through a data bus and configured to access data stored in the memory array through the data bus, the memory controller configured to couple to a host device through a channel and configured to perform operations comprising:
   obtaining, from the host device through the channel, partial row refresh information associated with a first row in the memory array, wherein the partial row refresh information includes an indication of a percentage of the first row to be refreshed; and
   refreshing a portion of the first row in the memory array based on the partial row refresh information.

2. The apparatus of claim 1, wherein the indication of the percentage of the first row to be refreshed includes a two bit value.

3. The apparatus of claim 2, wherein the indication of the percentage of the first row to be refreshed comprises one of:
   an indication to refresh twenty-five percent of the first row;
   an indication to refresh fifty percent of the first row;
   an indication to refresh seventy-five percent of the first row; or
   an indication to refresh one-hundred percent of the first row.

4. The apparatus of claim 1, wherein the memory controller is configured to perform operations further comprising:
   receiving, from the host device, an indication to enter a self-refresh mode,
   wherein after receiving the indication to enter the self-refresh mode, the memory controller performs the refreshing of a portion of the first row in the memory array based on the partial row refresh information.

5. The apparatus of claim 4, wherein receiving the indication to enter the self-refresh mode comprises receiving an indication of the host device entering a sleep mode.

6. The apparatus of claim 1, wherein the partial row refresh information is comprised in address information associated with the first row.

7. The apparatus of claim 1, wherein refreshing a portion of the first row in the memory array based on the partial row refresh information comprises:

determining a portion of the first row to be refreshed based on the partial row refresh information; and activating one or more sense amplifiers corresponding to one or more blocks of the first row based on the portion of the first row to be refreshed.

8. The apparatus of claim 7, wherein determining the portion of the first row to be refreshed comprises decoding the partial row refresh information.

9. The apparatus of claim 1, wherein the memory array comprises a low power double data rate (LPDDR) memory array.

10. A method, comprising:

obtaining, by a memory controller from a host device through a channel, partial row refresh information associated with a first row in a memory array, wherein the partial row refresh information includes an indication of a percentage of the first row to be refreshed; and refreshing, by the memory controller, a portion of the first row in the memory array based on the partial row refresh information.

11. The method of claim 10, wherein the indication of the percentage of the first row to be refreshed includes a two bit value.

12. The method of claim 11, wherein the indication of the percentage of the first row to be refreshed comprises one of:

an indication to refresh twenty-five percent of the first row;

an indication to refresh fifty percent of the first row;

an indication to refresh seventy-five percent of the first row; or an indication to refresh one-hundred percent of the first row.

13. The method of claim 10, further comprising:

receiving, from the host device, an indication to enter a self-refresh mode, wherein after receiving the indication to enter the self-refresh mode, the memory controller performs the refreshing of a portion of the first row in the memory array based on the partial row refresh information.

14. The method of claim 13, wherein receiving the indication to enter the self-refresh mode comprises receiving an indication of the host device entering a sleep mode.

15. The method of claim 10, wherein the partial row refresh information is comprised in address information associated with the first row.

16. The method of claim 10, wherein refreshing, by the memory controller, a portion of the first row in the memory array based on the partial row refresh information comprises:

determining a portion of the first row to be refreshed based on the partial row refresh information; and activating one or more sense amplifiers corresponding to one or more blocks of the first row based on the portion of the first row to be refreshed.

17. The method of claim 16, wherein determining a portion of the first row to be refreshed comprises decoding the partial row refresh information.

18. The method of claim 10, wherein the memory array comprises a low power double data rate (LPDDR) memory array.

* * * * *